United States Patent
Brandl et al.

(10) Patent No.: US 10,008,440 B2
(45) Date of Patent: Jun. 26, 2018

(54) CARRIER FOR AN ELECTRICAL COMPONENT

(71) Applicant: OSRAM Opto Semiconductors GmbH, Regensburg (DE)

(72) Inventors: Stefan Brandl, Regensburg (DE); Tilman Eckert, Penang (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 22 days.

(21) Appl. No.: 15/327,297

(22) PCT Filed: Jul. 22, 2015

(86) PCT No.: PCT/EP2015/066715
§ 371 (c)(1),
(2) Date: Jan. 18, 2017

(87) PCT Pub. No.: WO2016/012479
PCT Pub. Date: Jan. 28, 2016

(65) Prior Publication Data
US 2017/0179016 A1      Jun. 22, 2017

(30) Foreign Application Priority Data
Jul. 24, 2014  (DE) .................. 10 2014 110 473

(51) Int. Cl.
*H01L 23/498* (2006.01)
*H01L 23/00* (2006.01)
(Continued)

(52) U.S. Cl.
CPC .... *H01L 23/49838* (2013.01); *H01L 21/4846* (2013.01); *H01L 23/49894* (2013.01);
(Continued)

(58) Field of Classification Search
CPC ......... H01L 23/49838; H01L 23/49894; H01L 24/32; H01L 33/62; H01L 21/4846;
(Continued)

(56) References Cited

U.S. PATENT DOCUMENTS 3,770,874 A * 11/1973 Krieger .................. H01L 24/81
                                                          174/257
4,244,002 A * 1/1981 Sato ........................ H01L 24/11
                                                          257/737

(Continued)

FOREIGN PATENT DOCUMENTS

DE          69937180 T2     7/2009
DE       102012109161 A1    5/2014
(Continued)

*Primary Examiner* — Roy Potter
(74) *Attorney, Agent, or Firm* — Slater Matsil, LLP

(57) ABSTRACT

A carrier for an electrical component, including a substrate having a surface, with an electrically conductive contact zone arranged on the surface of the substrate, a solder pad disposed on the contact zone, and a solder stop structure disposed laterally next to the solder pad. The solder stop structure has a surface that is less wettable with liquid solder than a surface of the contact zone. The solder stop structure subdivides the contact zone into a first zone region and a second zone region, with the first zone region having the solder pad. The solder stop structure extends over a portion of a total length of the contact zone such that the contact zone has a free connecting region that is free of the solder stop structure. The first and second zone regions are connected to one another by means of the free connecting region.

15 Claims, 2 Drawing Sheets

(51) Int. Cl.
*H01L 33/62* (2010.01)
*H01S 5/022* (2006.01)
*H01L 21/48* (2006.01)

(52) U.S. Cl.
CPC .............. *H01L 24/32* (2013.01); *H01L 24/83* (2013.01); *H01L 33/62* (2013.01); *H01S 5/02272* (2013.01); H01L 2224/32221 (2013.01); H01L 2224/83801 (2013.01); H01L 2924/05042 (2013.01); H01L 2924/05442 (2013.01); H01L 2924/12041 (2013.01); H01L 2924/12042 (2013.01); H01L 2924/15787 (2013.01); H01L 2933/0066 (2013.01)

(58) Field of Classification Search
CPC ............. H01L 24/83; H01L 2933/0066; H01L 2224/32221; H01L 2924/12041; H01L 2924/12042; H01L 2224/83801; H01L 2224/0401; H01L 2224/84801; H01L 2224/11849; H01L 25/167; H01L 2224/81801; H01L 2224/02245; H01L 2224/81815; H01L 2224/83051; H01S 5/02272
See application file for complete search history.

(56) References Cited

U.S. PATENT DOCUMENTS

| | | | | |
|---|---|---|---|---|
| 4,835,345 | A * | 5/1989 | Haarde | ................... H05K 1/116 174/263 |
| 5,453,582 | A * | 9/1995 | Amano | ................... B23K 35/34 174/260 |
| 6,180,962 | B1 | 1/2001 | Ishinaga | |
| 6,362,435 | B1 | 3/2002 | Downey et al. | |
| 7,276,740 | B2 | 10/2007 | Kim et al. | |
| 7,709,854 | B2 | 5/2010 | Bando et al. | |
| 2002/0190262 | A1 | 12/2002 | Nitta et al. | |
| 2013/0134471 | A1 | 5/2013 | Lee et al. | |
| 2014/0001637 | A1 | 1/2014 | Ohsumi et al. | |
| 2015/0236294 | A1 | 8/2015 | Schicktanz et al. | |

FOREIGN PATENT DOCUMENTS

| | | |
|---|---|---|
| JP | 2002314143 A | 10/2002 |
| JP | 2006313897 A | 11/2006 |
| JP | 2008112966 A | 5/2008 |

* cited by examiner

CARRIER FOR AN ELECTRICAL COMPONENT

This patent application is a national phase filing under section 371 of PCT/EP2015/066715, filed Jul. 22, 2015, which claims the priority of German patent application 10 2014 110 473.0, filed Jul. 24, 2014, each of which is incorporated herein by reference in its entirety.

TECHNICAL FIELD

The invention relates to a carrier for an electrical component and to a method for producing a carrier.

BACKGROUND

Carriers for electrical components, in particular for semiconductor lasers, are known, for example, from U.S. Pat. No. 7,655,957 B2. A carrier may comprise one or more contact zones, by means of which an electrical component is electrically and mechanically connected to the carrier.

SUMMARY OF THE INVENTION

A carrier and a method for producing a carrier is provided, the carrier allowing an improved solder connection between the component and the contact zone of the carrier.

One advantage of the described carrier is that a defined solder connection between the component and the carrier is made possible. This is achieved by the contact zone being subdivided into a first and a second zone region with the aid of a solder stop structure. Furthermore, the solder stop structure extends only over a part of the total length of the contact zone so that a free connecting region of the contact zone remains. The first and the second zone region are connected to one another by means of the connecting region.

The first zone region comprises the solder pad. With the aid of the solder stop structure, flow of the liquid solder onto the solder stop structure is impeded, or avoided. In this way, a defined solder layer is formed between the carrier and the component. In this way, it is possible to save on solder material. Furthermore, with the aid of the solder stop structure, the solder material can be essentially restricted to the first zone region. The flow of the solder material into disadvantageous regions of the contact zone is therefore made more difficult. Furthermore, an improved distribution of solder can be achieved.

In one embodiment, the solder stop structure is applied in the form of a layer onto the contact zone. In this way, the contact zone can be formed in a simple geometry with the aid of a simple process. The solder stop structure itself is applied in the form of a separate layer with the aid of a further process. The material for the solder stop structure can therefore be selected freely in wide ranges.

In another embodiment, the solder stop structure is formed by an uncovered part of the surface of the substrate. This embodiment offers the advantage that no further process is necessary for depositing the solder stop structure, but rather it is possible to use the conventional processes for forming the contact zone, the contact zone being produced in the desired geometry while leaving a solder stop structure free.

In one embodiment, the solder stop structure is formed by a silicon layer or a silicon nitride layer or a silicon oxide layer. These materials may, if necessary, be deposited simply and economically, or the surface of the substrate may be provided with these materials. In this way, a simple and economical carrier is provided.

In another embodiment, the first and the second zone region are connected to one another by means of a connecting region. In this way, an electrical and mechanical connection between the zone regions is formed. The connecting region may be provided in order to take up excess solder material of the solder pad.

In one embodiment, the solder stop structure is arranged parallel to a side face of the component. This can ensure that solder material does not flow out laterally beyond the zone region of the component during melting. The second zone region is therefore kept free of solder material and can be kept free for other electrical contacts or connections.

In another embodiment, when there is a mounted component, the connecting region is assigned to a side face of the component, solder material flowing into the connecting region during the soldering process. In this way, it is possible to check the solder process with the aid of an optical check, for example, with the aid of a camera. Furthermore, the solder stop structure prevents too much solder material flowing from the first zone region into the second zone region. Nevertheless, optical checking of the solder connection is however possible.

As the electrical component, it is possible to use an optoelectronic component, in particular a semiconductor laser or a light-emitting diode. Furthermore, a power semiconductor may be used as the electrical component.

BRIEF DESCRIPTION OF THE DRAWINGS

The above-described properties, features and advantages of this invention, as well as the way in which they are achieved, will become more clearly and readily comprehensible in conjunction with the following description of the exemplary embodiments, which will be explained in more detail in connection with the drawings, in which.

DETAILED DESCRIPTION OF ILLUSTRATIVE EMBODIMENTS

Figure 1:
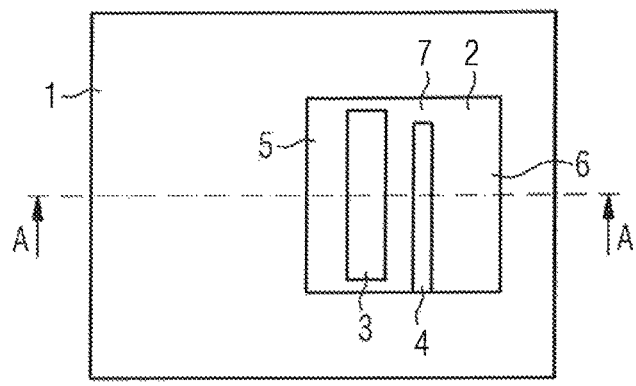
FIG. 1 represents a schematic plan view of a carrier.

FIG. 1 shows, in a schematic plan view, a carrier having a substrate 1, a contact zone 2 being applied on the substrate 1. The contact zone 2 consists of an electrically conductive material, for example, a metal. A solder pad 3 is arranged on the contact zone 2. The solder pad 3 consists of a solid solder material, which has, for example, been printed onto the contact zone 2. A solder stop structure 4 is furthermore provided, which subdivides the contact zone 2 into a first zone region 5 and a second zone region 6. The first and the second zone regions 5, 6 are connected to one another by means of a connecting region 7. In the embodiment represented, the solder stop structure 4 does not extend over the total length of the contact zone 2. A free connecting region 7 therefore remains, by means of which the first and the second zone regions 5, 6 are connected to one another.

Figure 2:
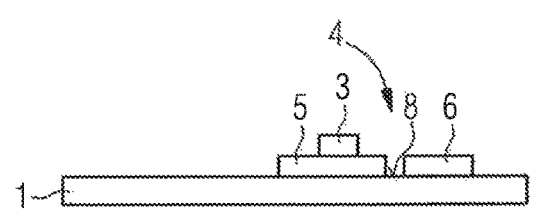
FIG. 2 represents a cross section through the carrier of FIG. 1.

FIG. 2 shows a cross section A-A through the carrier of FIG. 1. It can be seen that, in this exemplary embodiment, the solder stop structure 4 is formed by a surface 8 of the substrate 1. The surface 8 may, for example, comprise silicon, silicon nitride and/or silicon oxide. Furthermore, the surface 8 may also comprise other materials, the property of which is that molten solder wets the material scarcely or not at all. In this embodiment, during the deposition of the metal contact zone 2, the contact zone 2 has been structured, for example, by photolithography, metal evaporation, lift-off, etc., in such a way that a strip on the surface 8 in the form of the solder stop structure 4 has not been covered by the contact zone 2. In this embodiment, therefore, no additional process is therefore introduced. The required structures are established in the mask design in a mask. The surface 8 may, for example, be constituted by the material of the substrate, which consists, for example, of silicon. Furthermore, the substrate 1 may be provided with a separate surface layer which has the desired properties of nonwetting by liquid solder material. To this end, silicon nitride, silicon oxide or silicon may again be used.

Figure 3:
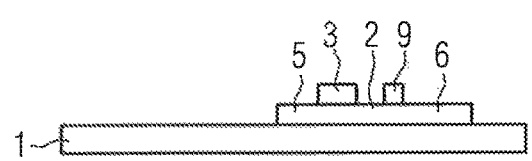
FIG. 3 represents a cross section through a further embodiment of a carrier.

FIG. 3 shows a further embodiment, in which the solder stop structure 4 is configured in the form of a separate layer 9. The layer 9 is applied onto the contact zone 2. The layer 9 may consist of any material which is wetted with difficulty or not at all by liquid solder. For example, the layer 9 may consist of silicon, silicon nitride or silicon oxide.

Figure 4:
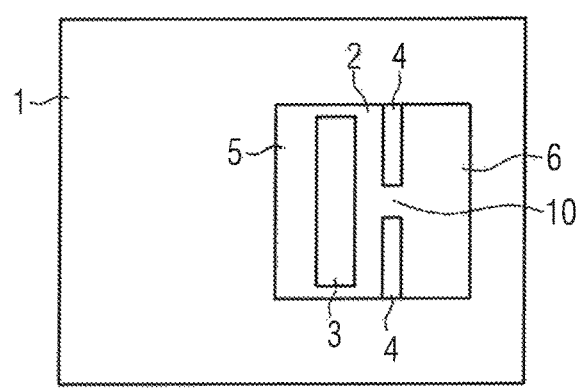
FIG. 4 represents a further embodiment of a carrier.

FIG. 4 shows a further embodiment of a carrier, in which the solder stop structure 4 consists of two sections, which are laid transversely over the contact zone 2. The two sections 4 are arranged along an axis and are separated from one another by a fixed distance 10.

Figure 5:
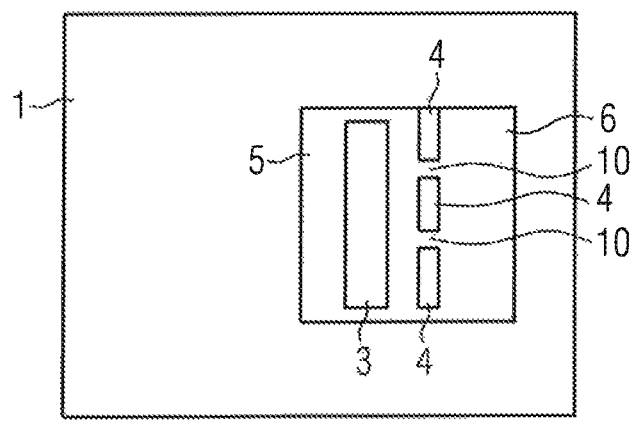
FIG. 5 represents a further embodiment of a carrier.

FIG. 5 shows, in a schematic representation, a plan view of a further embodiment of a carrier, in which the solder stop structure 4 is configured in the form of three sections, each two sections having a fixed distance 10. The solder stop structures 4 of FIGS. 4 and 5 may be configured, depending on the exemplary embodiment selected, according to the embodiment of FIG. 2 in the form of the surface 8 of the substrate 1 or in the form of a separate layer 9 according to FIG. 3.

Figure 6:
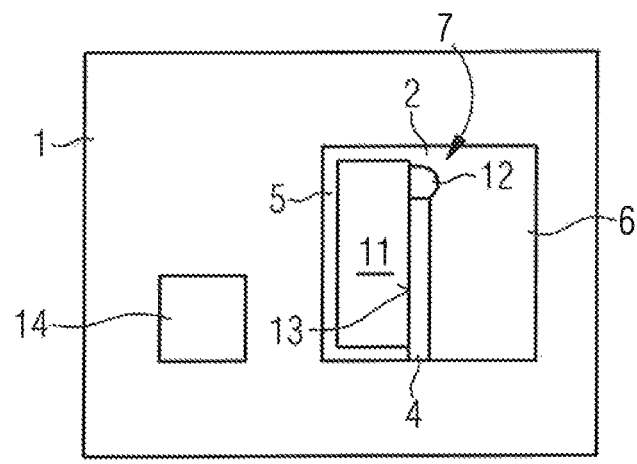
FIG. 6 represents a carrier having an electrical component.

FIG. 6 shows, in a schematic plan view, a carrier on which an electrical component 11, for example, a semiconductor chip, an optoelectronic component, a semiconductor laser, a light-emitting diode or a power semiconductor, is electrically and mechanically connected to a contact zone 2 of the substrate 1 by means of a melted solder pad (not shown). Because of the solder stop structure 4, lateral flow of the solder material into the second zone region 6 is avoided. Only in the connecting region 7 is there lateral flow of solder material 12. In the exemplary embodiment represented, the solder stop structure 4 is oriented along a side face 13 of the component 11. The solder material 12 extending laterally beyond the component 11 may be used in order to control the soldering process with the aid of an optical check. If no solder material has emerged, for example, this indicates that the solder pad has not been liquefied and there is not a sufficient solder connection between the contact zone 2 and the component 11.

Depending on the embodiment selected, the solder stop structure 4 may also be configured along the entire side length of the component 11. This offers the advantage that no solder material flows laterally from the first zone region 5 into the second zone region 6. This embodiment, however, has the disadvantage that optical checking of the soldering process is not possible.

Depending on the embodiment selected, further electrical circuits 14 may be integrated into the substrate 1. The further electrical circuits 14 may, for example, be provided for driving the component 11. A component 11 may correspondingly also be mounted on the embodiments of FIGS. 2 to 5.

The described carrier allows improved self-alignment between the component 11 and the substrate 1. Because of the solder stop structure 4, the solder material cannot flow so much, so that the component 11 likewise can change its position only to a small extent. Furthermore, a controlled solder distribution below the component is achieved with the aid of the carrier described. Reproducible thermal bonding between the component 11 and the substrate 1, or the contact zone 2, is therefore made possible. Positive effects for the lifetime are thereby achieved.

Furthermore, the further zone region 6, which is used, for example, for further contacting by means of wire bonding, is kept free of solder material. The process window for further processing is therefore increased. Furthermore, the component 11 is protected by the solder stop structure 4 for critical subsequent processes. By virtue of the newly proposed carrier, it is possible to achieve a reduction of the solder pad thickness, and therefore a saving on solder material. Solder material may consist of up to 70% gold, and therefore be relatively expensive. Furthermore, the new carrier allows less outlay for optimization of the solder pad shape and the solder pad thickness. To a large extent, smaller process variations and lower outlay for optimization of the soldering process are achieved with the aid of the new carrier.

The solder stop structure 4 and the solder pad 3 may be arranged on an upper side and/or on a lower side of a carrier.

Although the invention has been illustrated and described in detail with the preferred exemplary embodiment, the invention is not restricted by the examples disclosed, and other variants may be derived therefrom by the person skilled in the art, without departing from the protective scope of the invention.

The invention claimed is:

1. A carrier for an electrical component, comprising:
   a substrate having a surface, wherein an electrically conductive contact zone is arranged on the surface of the substrate;
   a solder pad disposed on the contact zone; and
   a solder stop structure disposed laterally next to the solder pad;
   wherein the solder stop structure has a surface that is less wettable with liquid solder than a surface of the contact zone, wherein the solder stop structure subdivides the contact zone into a first zone region and a second zone region, the first zone region having the solder pad, wherein the solder stop structure extends over a portion of a total length of the contact zone such that the contact zone has a free connecting region that is free of the solder stop structure, wherein the first zone region and the second zone region are connected to one another by means of the free connecting region, and wherein the electrical component is an optoelectronic component selected from a semiconductor laser, a light-emitting diode, or a power semiconductor.

2. A carrier for an electrical component, comprising:
   a substrate having a surface, wherein an electrically conductive contact zone is arranged on the surface of the substrate;
   a solder pad disposed on the contact zone; and
   a solder stop structure disposed laterally next to the solder pad;
   wherein the solder stop structure has a surface that is less wettable with liquid solder than a surface of the contact zone, wherein the solder stop structure subdivides the contact zone into a first zone region and a second zone region, the first zone region having the solder pad, wherein the solder stop structure extends over a portion of a total length of the contact zone such that the contact zone has a free connecting region that is free of the solder stop structure, wherein the first zone region and the second zone region are connected to one another by means of the free connecting region, and wherein the solder stop structure comprises at least one layer which is disposed on the contact zone.

3. The carrier as claimed in claim 2, wherein the solder stop structure comprises at least one of silicon, silicon nitride or silicon oxide.

4. A carrier for an electrical component, comprising:
a substrate having a surface, wherein an electrically conductive contact zone is arranged on the surface of the substrate;
a solder pad disposed on the contact zone; and
a solder stop structure disposed laterally next to the solder pad;
wherein the solder stop structure has a surface that is less wettable with liquid solder than a surface of the contact zone, wherein the solder stop structure subdivides the contact zone into a first zone region and a second zone region, the first zone region having the solder pad, wherein the solder stop structure extends over a portion of a total length of the contact zone such that the contact zone has a free connecting region that is free of the solder stop structure, wherein the first zone region and the second zone region are connected to one another by means of the free connecting region, wherein the solder stop structure is formed by a part of the surface of the substrate that is free of the contact zone, and wherein the first zone region and second zone region are formed in one piece and connected to one another by the free connecting region, and wherein the solder stop structure comprises silicon or silicon nitride or silicon oxide.

5. The carrier as claimed in claim 1, further comprising the electrical component;
wherein the electrical component is disposed in the first zone region, wherein the electrical component is mechanically connected to the contact zone by the solder pad, and wherein the solder stop structure is oriented along a side face of the electrical component.

6. The carrier as claimed in claim 1, further comprising the electrical component;
wherein the free connecting region is disposed along a side face of the electrical component, wherein solder material is disposed in at least the free connecting region and in the first zone region, and wherein the solder material is further disposed on the contact zone in a subregion of the second zone region that is adjacent to the free connecting region.

7. The carrier as claimed in claim 1, further comprising the electrical component;
wherein the electrical component is disposed in the first zone region, wherein the electrical component is mechanically connected to the contact zone by means of the solder pad, wherein the solder stop structure is oriented along a side face of the electrical component, wherein the side face of the electrical component is adjacent the solder stop structure, wherein the side face of the electrical component is further adjacent to the free connecting region, and wherein solder material extends laterally beyond the electrical component in a region adjacent to the free connecting region and into at least the free connecting region.

8. The carrier as claimed in claim 1, further comprising the electrical component;
wherein the free connecting region is disposed at a side face of the electrical component, wherein solder material is disposed in at least the free connecting region and in the first zone region, and wherein the solder material is further disposed in a subregion of the second zone region adjacent to the free connecting region, wherein the side face of the electrical component is adjacent to the solder stop structure, wherein the side face of the electrical component is further adjacent to the free connecting region with the side face, and wherein solder material extends laterally beyond the electrical component in a region of the contact zone adjacent to the free connecting region and has a portion disposed in at least the free connecting region.

9. The carrier as claimed in claim 1, further comprising the electrical component;
wherein the electrical component is arranged in the first zone region, wherein the electrical component is mechanically connected to the contact zone by the solder pad, and wherein the solder stop structure is oriented along a side face of the electrical component.

10. The carrier as claimed in claim 1, further comprising the electrical component;
wherein the free connecting region is adjacent to a side face of the electrical component, wherein solder material is disposed in the free connecting region and the first zone region, and wherein the solder material is disposed in a subregion of the second zone region adjacent to the free connecting region.

11. A method for producing a carrier for an electrical component, comprising:
producing an electrically conductive contact zone on a surface of a substrate;
applying a solder pad onto the contact zone; and
forming a solder stop structure laterally next to the solder pad;
wherein the solder stop structure has a surface that is less wettable with liquid solder than a surface of the contact zone, wherein the solder stop structure subdivides the contact zone into a first zone region and a second zone region, the first zone region having the solder pad, wherein the solder stop structure extends over a portion of a total length of the contact zone such that the contact zone has a free connecting region that is free of the solder stop structure, and wherein the first zone region and the second zone region are connected to one another by the free connecting region, wherein the electrical component is an optoelectronic component selected from a semiconductor laser, a light-emitting diode, or a power semiconductor.

12. A method for producing a carrier for an electrical component, comprising:
producing an electrically conductive contact zone on a surface of a substrate;
applying a solder pad onto the contact zone; and
forming a solder stop structure laterally next to the solder pad;
wherein the solder stop structure has a surface that is less wettable with liquid solder than a surface of the contact zone, wherein the solder stop structure subdivides the contact zone into a first zone region and a second zone region, the first zone region having the solder pad, wherein the solder stop structure extends over a portion of a total length of the contact zone such that the contact zone has a free connecting region that is free of the solder stop structure, and wherein the first zone region and the second zone region are connected to one another by the free connecting region, wherein forming the solder stop structure comprises forming the solder stop structure by applying a layer onto the contact zone.

13. The method as claimed in claim 11, wherein producing an electrically conductive contact zone on the surface of the substrate includes applying the contact zone onto the substrate such that the solder stop structure is formed by a portion of the surface of the substrate that is free of the contact zone.

14. The method as claimed in claim 11, further comprising arranging an electrical component on the solder pad such that the electrical component is oriented with a side face along the solder stop structure and such that the free connecting region is disposed along the side face of the electrical component;

wherein, during the arranging the electrical component on the solder pad, solder material flows onto at least the free connecting region, and wherein, after the electrical component is arranged on the solder pad, the electrical component is mechanically connected to the contact zone by the solder pad.

15. The method as claimed in claim 14, wherein, during the arranging the electrical component on the solder pad, solder material flows onto a subregion of the second zone region.

\* \* \* \* \*